United States Patent [19]
McGouey

[11] 4,308,592
[45] Dec. 29, 1981

[54] PATTERNED KILL OF MAGNETORESISTIVE LAYER IN BUBBLE DOMAIN CHIP

[75] Inventor: Richard P. McGouey, Brewster, N.Y.

[73] Assignee: International Business Machines Corporation, Armonk, N.Y.

[21] Appl. No.: 53,489

[22] Filed: Jun. 29, 1979

[51] Int. Cl.[3] ........ G11C 19/08
[52] U.S. Cl. ........ 365/8; 365/36; 365/39
[58] Field of Search ........ 365/36, 41, 8, 39

[56] References Cited

U.S. PATENT DOCUMENTS

| | | | |
|---|---|---|---|
| 3,967,002 | 6/1976 | Almasi et al. | 365/36 |
| 4,070,658 | 1/1978 | Giess et al. | 365/41 |
| 4,164,026 | 8/1979 | Almasi et al. | 365/36 |
| 4,164,029 | 8/1979 | Keefe | 365/36 |

OTHER PUBLICATIONS

IBM Tech. Disc. Bull.-vol. 21, No. 4, Sep. 1978, pp. 1706-1707.

*Primary Examiner*—James W. Moffitt
*Attorney, Agent, or Firm*—Jackson E. Stanland

[57] ABSTRACT

A technique and structure is described in which bubble domain devices can be made, and particularly bubble domain devices comprisng contiguous propagation elements. A thin magnetoresistive layer, such as permalloy, is blanket deposited over a substrate including a bubble domain film, and is then selectively "poisoned" to destroy its magnetization except in those areas where thin sensors are to be provided. The poisoned portions of the magnetoresistive layer serve as a plating base for conductor metallurgy which can be used as an ion implantation mask, and for carrying electrical current. This eliminates some process steps which had been required in the prior art, and does not leave magnetic permalloy in those areas of the bubble domain chip were they would adversely affect propagation of domains by ion implanted contiguous propagation elements. This technique can also be used to make bubble domain devices having gapped propagation elements.

6 Claims, 8 Drawing Figures

PATTERNED KILL OF MAGNETORESISTIVE LAYER IN BUBBLE DOMAIN CHIP

DESCRIPTION

1. Technical Field

This invention relates to magnetic bubble domain storage chips, and more particularly to an improved process for making these chips.

2. Background Art

In the fabrication of magnetic bubble domain storage chips, it is common to use a thin magnetic layer, such as NiFe, which serves as a layer from which bubble domain magnetoresistive sensors are fabricated. While it is customary to provide a blanket layer of NiFe and then to delineate sensors from that layer, it is often the situation that the thin NiFe layer cannot be left in other portions of the magnetic chip, without causing adverse effects.

As an example of the type of adverse effects which can be caused when the thin NiFe layer is left in portions other than the sensor area, the fabrication of contiguous propagation element magnetic bubble devices often includes an ion implantation step in which a magnetic layer is implanted with ions through an ion implantation mask. This mask is typically a patterned layer of a metal, such as gold. The regions of the magnetic layer around the gold mask are ion implanted to have in-plane magnetization. If, however, the thin NiFe layer is left under the gold implantation mask, the propagation margins for bubble domain movement along the ion implanted regions are adversely affected by the magnetic properties of the NiFe layer.

In the prior art technique for making contiguous propagation element bubble devices using ion implantation, a continuous layer of NiFe is deposited over a substrate including a magnetic bubble domain film. The sensor portions are then defined by ion milling the remaining portions of the NiFe layer. A dielectric layer, such as $SiO_2$, is then sputtered onto the substrate and over a portion of the sensor NiFe, which is now protected by a resist layer. A thin plating base, typically Nb-Au, is then deposited over the $SiO_2$ layer and a resist pattern is produced for defining the ion implantation mask. Gold is electroplated on the Nb-Au plating base layer, using the photoresist pattern as a mask. After this, the photoresist is removed and the excess plating base is removed by ion milling.

Thus, in the practice of this prior art process, the sensor must be protected by a dielectric layer and a plating base other than the NiFe layer must be used. Additionally, the NiFe layer must not be left under the gold ion implantation mask, since its presence will adversely affect propagation of bubbles by the ion implanted regions.

In this prior art process, via-hole lithography must also be utilized, since openings must be made through the dielectric layer in order to contact the sensor, for provision of electrical current therethrough. This is an additional disadvantage with that process, since it is often difficult to provide such contacts in a reliable way.

Accordingly, it is a primary object of the present invention to provide an improved process for making a magnetic bubble domain chip using contiguous propagation elements.

It is another object of the present invention to provide a magnetic bubble domain storage clip, in which a thin layer of NiFe is used for both the provision of magnetoresistive sensors and as a plating base for an ion implantation mask, wherein the portions of said NiFe layer used as a plating base have been chemically altered to destroy their magnetization.

It is another object of the present invention to provide an improved process for making bubble domain storage devices having ion implanted contiguous propagation elements.

It is another object of the present invention to provide a magnetic bubble domain storage chip having ion implanted contiguous propagation elements wherein the ion implantation mask is comprised of a thin layer of magnetoresistive material whose magnetization has been substantially eliminated.

It is another object of the present invention to produce a magnetic bubble domain storage clip having contiguous propagation elements, and including a layer of NiFe having essentially zero magnetization in selected portions thereof.

SUMMARY OF THE INVENTION

This invention describes a magnetic bubble domain storage clip including a layer of magnetoresistive material, such as NiFe, whose magnetization is locally altered to be essentially zero in selected regions thereof, and where other portions of said layer are used to define magnetoresistive bubble sensors.

In the practice of this invention, a thin magnetoresistive layer, such as NiFe, is provided as a continuous layer over the entire substrate, which includes a magnetic bubble domain film. Portions of this magnetoresistive layer are then chemically altered to make them non magnetic. These non magnetic regions serve as a plating base for the plating of an electrically conductive layer, which serves as an ion implantation mask and also as a current carrying conductor layer. After this, the magnetically active regions of the magnetoresistive layer are protected and the remaining portions of the magnetoresistive layer, except those onto which the electrically conductive layer was plated, are removed by an etching step. Ion implantation then occurs to convert those portions of a magnetic layer unprotected by said electrically conductive layer to an in-plane magnetization, in order to define ion implanted propagation elements.

In the practice of this invention, the magnetoresistive layer serves not only as a layer from which magnetic bubble domain sensors can be provided, but also as a plating base for plating of the electrically conductive layer which will serve to provide electrical current to devices on the magnetic chip, and also as an ion implantation mask. In contrast with the prior art, where the magnetoresistive layer could not be left in the regions of the ion implanted propagation elements, the magnetoresistive layer can now be left because its magnetic properties have been altered to essentially destroy its magnetization in those regions.

This is an entirely planar process, since the magnetoresistive layer is left on the substrate as a continuous layer during chip processing, rather than being removed in certain portions. This means that step coverage by additional layers is not required. Further, the provision of an additional plating base layer is not needed in this invention, nor is a dielectric layer required for protecting the sensor areas. Of course, this means that via-hole lithography will not have to be utilized when making electrical contact to the sensor.

These and other objects, features, and advantages will be more apparent from the following more particular description of the preferred embodiment.

BEST MODE FOR CARRYING OUT THE INVENTION

Figure 1:
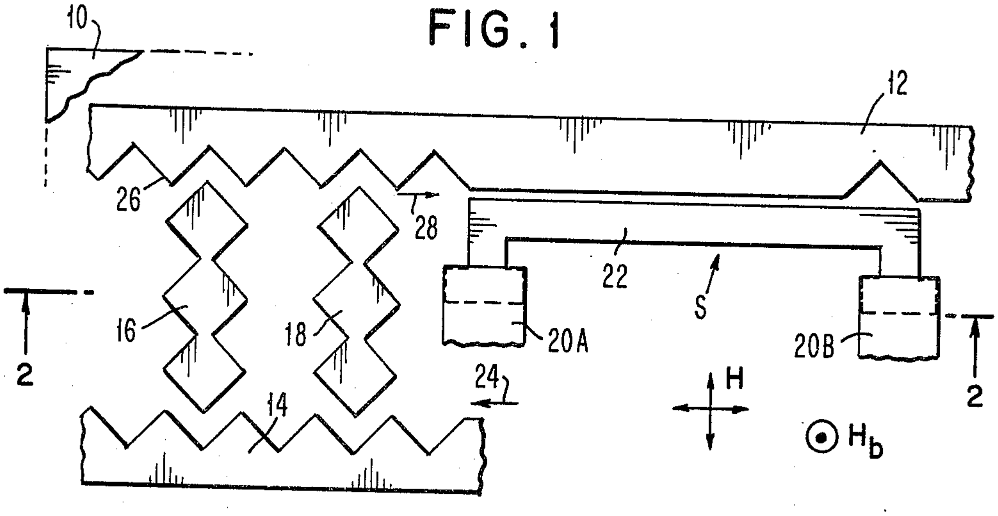
FIG. 1 is a top view of a contiguous propagation element bubble domain circuit, showing storage registers, a major read path, a major write path, and a stretcher/sensor.

FIG. 1 shows a top view of a magnetic bubble domain storage chip which is comprised of contiguous propagation elements. Two conductive layers are shown in this figure, where the conductive layers are formed over a substrate 10, which includes a magnetic bubble domain film. One of the conductive layers is used as an ion implantation mask and for providing current carrying conductors. A typical material to be used for this layer is gold, although other metals can also be used as ion implantation masks and as current carrying conductors. This layer comprises the portions 12, 14, 16, 18, 20A, and 20B. A magnetoresistive layer is located beneath this conductive layer, and includes the bubble domain sensor S, which is comprised of a magnetoresistive strip 22. A suitable magnetoresistive material is NiFe. Conductive portions 20A and 20B make electrical contact to the magnetoresistive sensor 22, as is well known in the art.

The operation of the circuit of FIG. 1 is well known and will not be described in great detail. Regions of the substrate 10 located around the gold conductor layer are ion implanted to provide propagation elements for movement of bubble domains in response to the reorientation of a magnetic field H in the plane of the substrate 10. A magnetic bias field $H_b$ is perpendicular to the plane of substrate 10, and stabilizes the diameter of the bubble domains.

The ion implanted regions located around mask portion 14 form a write major path along which bubble domains move in the direction of arrow 24, from a bubble domain generator (not shown). These bubble domains can be transferred to storage registers comprising the ion implanted regions around mask portions 16 and 18. A transfer gate for providing transfer of bubble domains from the write major path into the storage registers is shown in U.S. Pat. No. 4,142,250 and the use of electrical conductor 14 as the transfer conductor is shown in copending application Ser. No. 839,720, filed Oct. 5, 1977, now U.S. Pat. No. 4,164,029.

The ion implanted region located adjacent to the undulating edge 26 of mask portion 12 provides a read major path to which bubble domains are transferred after propagation in the storage registers. In response to the reorientation of field H, these bubble domains will move along the read major path in the direction of arrow 28 toward the sensor S. Current through conductor 12 in the region of the conductor adjacent to sensing element 22 will aid elongation of a domain in the vicinity of the sensing element 22. The elongated domain will be sensed by the magnetoresistive element 22 in a manner well known in the art. After being sensed, the bubble domain can be annihiliated in a known manner.

In the fabrication of a magnetic bubble domain chip, such as that shown in FIG. 1, wherein contiguous propagation elements are provided by ion implantation, and wherein a magnetoresistive sensor has to be provided, it is generally the situation that the sensing element 22 is delineated prior to formation of the ion implanted contiguous propagation elements. This means that the magnetoresistive material will only be present in the areas where the sensors S are to be defined, and that a thin plating base will have to be provided for plating of the mask portions 12, 14, 16, 18, 20A, and 20B. Still further, a dielectric layer is provided for protecting the sensor during the ion implant operation. This is required since the gold implantation mask cannot be formed over the entire area of the sensor 22, since this will result in electrical shorting of the sensor.

The process illustrated in FIGS. 2A–2G eliminates the need to provide a dielectric protect layer for the sensor and further eliminates the need for an additional plating base layer.

Figure 2A:
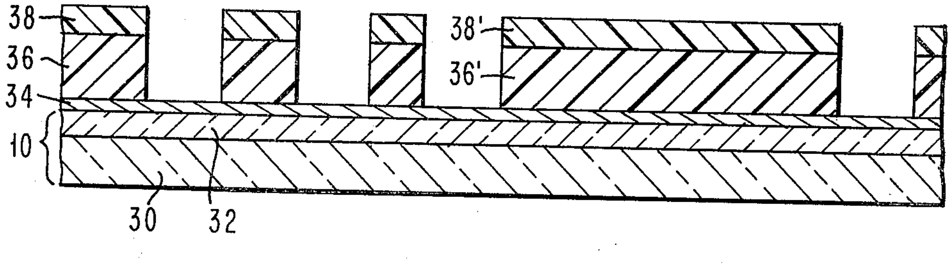
FIGS. 2A–2G illustrate the present process for making the bubble domain chip of FIG. 1, where these figures are cross sectional views of the magnetic chip of FIG. 1, taken along the line 2—2.

In more detail, FIG. 2A shows a cross sectional view in which the substrate 10 includes a layer 30 in which magnetic bubble domains can exist and be moved, as well as a dielectric layer 32 located thereover. Layer 32 is typically $SiO_2$ which has a thickness of about 2,000 Å. Its purpose is to protect the bubble domain film 30 during a later etching step.

A magnetoresistive layer 34, having a typical thickness of 200–400 Å, is formed over dielectric layer 32. The magnetoresistive layer 34 is typically comprised of NiFe, which can be evaporated directly onto layer 32.

Two layers 36 and 38 of resist material are then deposited to provide a mask over layer 32. Resist layer 36 is typically about 1 micron thick and can be comprised of polymethyl methacrylate (PMMA), while layer 38 is typically about 5,000 Å of AZ 1350J, which is manufactured by the Shipley Company. Resist layer 36 is used to provide a gold ion implantation mask, while resist layer 38 will be used to provide liftoff of excessive amounts of the material which will be used to alter the magnetic properties of magnetoresistive layer 34. This will be more apparent in the following description.

Figure 2B:
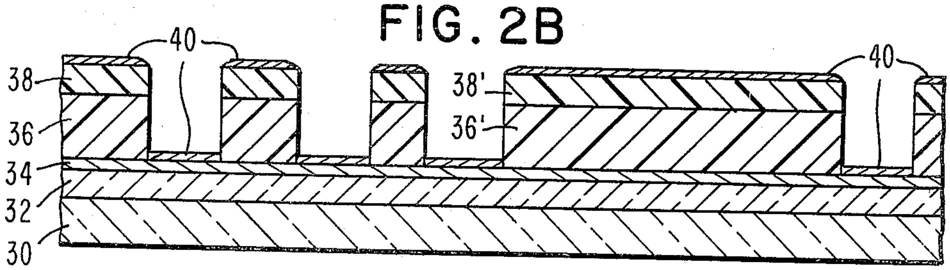

In FIG. 2B, a thin layer 40 of a dopant has been evaporated over the entire structure shown in FIG. 2A. Layer 40 can be comprised of a mixture of Ga and In, or other dopants such as Sn, Ta, etc. which will diffuse into layer 34 and substantially reduce its magnetization. Ga, or a GaIn alloy can be suitably used and provided by either evaporation or sputtering through the mask comprising resist layers 36 and 38. If the substrate comprising layer 34 is held between 60° C. and 80° C. during the deposition of layer 40, layer 40 will amalgamate with layer 34 and diffuse therein during the step in which layer 40 is provided. Only a small amount of layer 40 is required. For example, a total of about 100 Å or less is sufficient to provide enough dopant into layer 34 to substantially reduce the magnetization of the regions of layer 34 where dopant layer 40 is deposited.

Layer 34 has its magnetization substantially reduced to zero in all portions except where the sensors S are to be provided. For this reason, resist portions 36′ and 38′ are provided in the area where the sensor S is to be later formed.

Figure 2C:
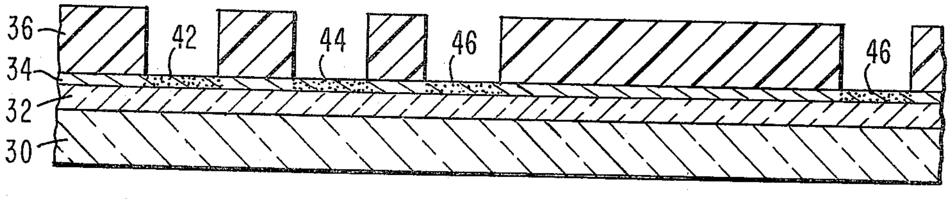

FIG. 2C shows the structure when layer 40 has amalgamated into the exposed portions of underlying layer 34, and in which the top resist layer has been dissolved away, using known solvents. The strippled portions 42, 44, 46, and 48 of layer 34 are those portions where the magnetization of that layer is now essentially zero.

Figure 2D:
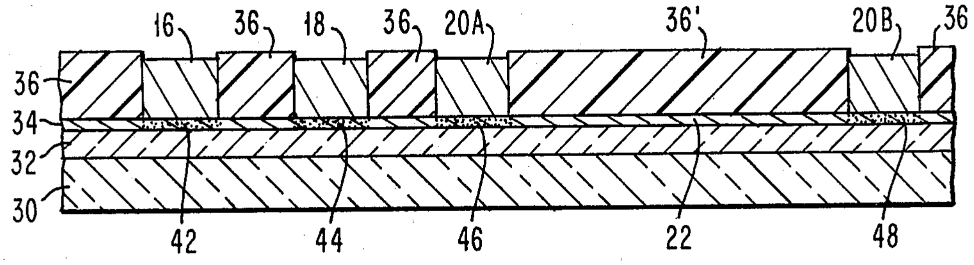

In FIG. 2D, an ion implantation/conductor layer has been electroplated onto the exposed portions of magnetoresistive layer 34. More specifically, this plating occurs onto magnetically destroyed portions 42, 44, 46, and 48. This electroplated conductive layer is comprised of the masks 12, 14, 16, 18, 20A, and 20B shown in FIG. 1. These same reference numerals are used in FIG. 2D to assist in relating this view to the circuit of FIG. 1. These electroplated regions 12–20B are approximately 6000 Å thick.

Figure 2E:
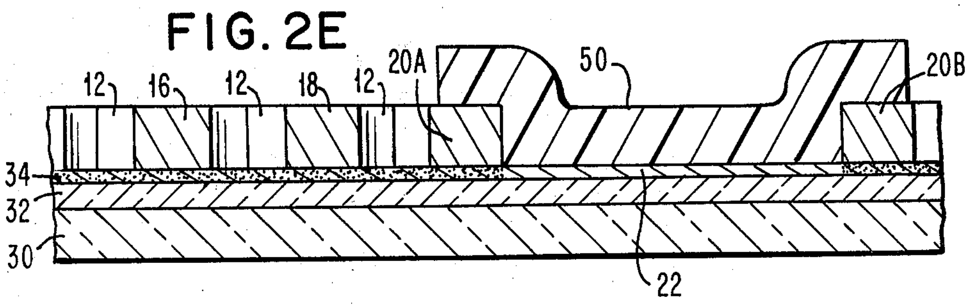

In FIG. 2E, resist layer 36 has been removed by dissolving it with a suitable solvent, and a new resist layer 50 has been applied in the sensor area, in order to define the sensor. Resist 50 is approximately 1.3 microns thick and is used to protect the sensor during a subsequent ion milling step. In FIG. 2E, resist layer 36 has been removed, so that mask portion 12 is now visible.

Figure 2F:
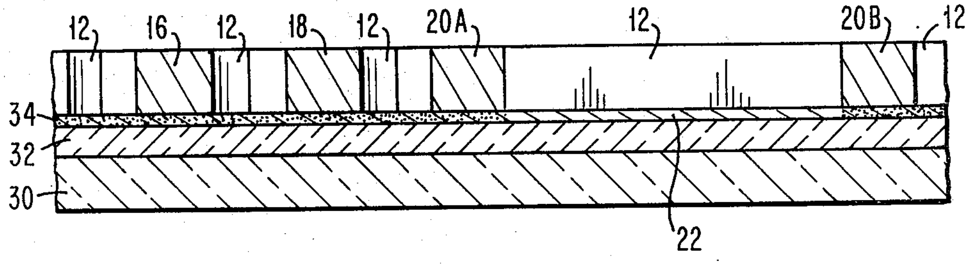

In FIG. 2F, the portions of magnetoresistive layer 34 not protected by the electroplated gold layer or by the resist layer 50 are ion milled. During this ion milling step, dielectric layer 32 protects the bubble domain film 30. This leaves the structure of FIG. 2F, where the magnetic properties of layer 34 are substantially eliminated, except in those portions where the sensor 22 is located. That is, the portions of layer 34 located under the conductive layer have been chemically altered to substantially reduce their magnetization.

Figure 2G:
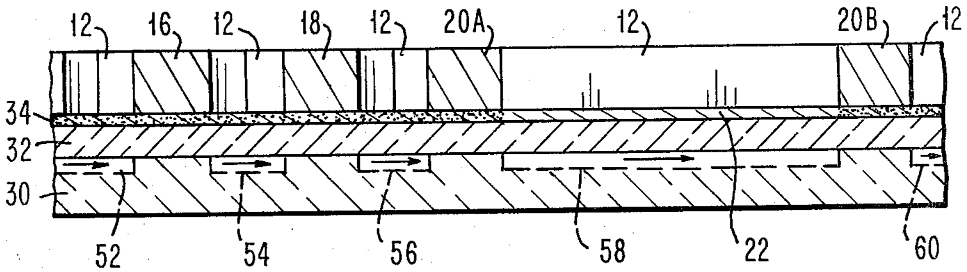

In FIG. 2G, the bubble domain film 30 has been ion implanted to provide regions 52, 54, 56, 58, and 60 which have in-plane magnetization, as represented by the horizontal arrows in these regions. These ion implanted regions 52–60 provide the propagation elements along the edges of which bubble domains in film 30 move as drive field H reorients. As is apparent from this figure, layer 34 is not magnetic in the regions adjacent to the edges of the ion implanted portions 52–60, and therefore layer 34 does not adversely affect propagation along the edges of the ion implanted regions. Thus, the altered portions of layer 34 still provide a plating base and a layer to which electrical contact can be made but, because they are non magnetic, they do not adversely affect propagation margins.

As is also apparent from FIG. 2G, the conductive portions 20A and 20B make electrical contact to the sensor 22 without having to be formed through a dielectric layer lying over the sensor. Electrical contact is made to portions of the NiFe layer 34 which have substantially zero magnetization, but which will provide a current path for electrical current going to the magnetoresistive portion 22 that functions as the bubble domain sensor.

As another feature of this invention, it should be noted that an entirely planar fabrication process is provided, since the layer 34 remains as a continuous layer until the very end of the process, when the unwanted portions of it are ion milled. Thus, the problem of step coverage over portions of this layer is not present in this technique.

While the invention has been particularly described with respect to a process for making magnetic bubble domain chips using ion implanted contiguous propagation elements, it will be understood by those of skill in the art that the concept described herein can be used for making magnetic bubble domain circuits comprising contiguous propagation elements, or gapped propagation elements, and to circuits wherein the contiguous propagation elements are provided by other than ion implanted regions of a magnetic layer. Also, while the structure shown herein is one in which the magnetic bubble domain layer 30 is ion implanted, the substrate 10 can also include a magnetic drive layer which is ion implanted in a situation in which the bubble domain layer 30 is not easily ion implanted.

In the further practice of the present invention, it should be understood that the materials used for the various layers can be changed in accordance with the same requirements. Thus, while gold is a particularly suitable ion implantation mask which also functions well as an electrical conductor, other materials can be used. Still further, while NiFe is a particularly suitable magnetoresistive material, other types of magnetoresistive materials can also be used, and other types of sensing can be employed. Also, while the ion implantation mask is shown as one which is conveniently electroplated, other deposition techniques can also be used. The main concept of the present invention is to provide a magnetic bubble domain chip in which a portion of a magnetic layer in that chip is altered, by chemical or other means, to substantially reduce its magnetization, while allowing the altered portion to remain in the magnetic chip for other functions.

Having thus described my invention, what I claim as new, and desire to secure by Letters Patent is:

1. A magnetic bubble domain chip, comprising:

a magnetic medium in which bubble domains can exist and be propagated, an ion implanted magnetic drive layer having ion implanted regions therein forming propagation elements along which said bubble domains move in response to the reorientation of a magnetic field substantially in the plane of said magnetic drive layer, a conductive layer forming an ion implantation mask and having portions thereof which are used as current carrying conductors, a layer of magnetoresistive material located between said magnetic medium and said conductive layer, where first portions of said magnetoresistive layer located beneath said electrically conductive layer have substantially zero magnetization and where second portions of said magnetoresistive layer not located under said conductive layer are bubble domain sensors, said sensors being electrically contacted by portions of said conductive layer.

2. The chip of claim 1, where said magnetoresistive layer is comprised of NiFe.

3. The chip of claim 1, wherein said propagation elements are contiguous to one another.

4. The chip of claim 1, where said ion implanted regions in said drive layer are laterally located around the area defined by said conductive layer, said conductive layer being a mask during the ion implantation step used to make said ion implanted propagation elements.

5. The chip of claim 1, where said first portions are chemically altered to have substantially zero magnetization.

6. The chip of claim 1, where said chip is comprised of planar layers including said conductive layer and said magnetoresistive layer, said conductive layer being located on said magnetoresistive layer.

* * * * *